(12) United States Patent
Wang et al.

(10) Patent No.: US 10,879,939 B2
(45) Date of Patent: Dec. 29, 2020

(54) DECODING METHOD AND DEVICE, AND DECODER

(71) Applicant: HUAWEI TECHNOLOGIES CO., LTD., Guangdong (CN)

(72) Inventors: Jun Wang, Hangzhou (CN); Rong Li, Hangzhou (CN); Huazi Zhang, Hangzhou (CN); Xian Meng, Hangzhou (CN); Xiaocheng Liu, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/264,014

(22) Filed: Jan. 31, 2019

(65) Prior Publication Data

US 2019/0165807 A1 May 30, 2019

Related U.S. Application Data

(63) Continuation of application No. PCT/CN2017/092179, filed on Jul. 7, 2017.

(30) Foreign Application Priority Data

Aug. 12, 2016 (CN) .......................... 2016 1 0665446

(51) Int. Cl.
*H03M 13/39* (2006.01)
*H03M 13/00* (2006.01)
(Continued)

(52) U.S. Cl.
CPC ....... *H03M 13/3927* (2013.01); *H03M 13/00* (2013.01); *H03M 13/091* (2013.01);
(Continued)

(58) Field of Classification Search
CPC ............... H03M 13/13; H03M 13/091; H03M 13/1108; H03M 13/2927; H03M 13/3927; H03M 13/6561
See application file for complete search history.

(56) References Cited

U.S. PATENT DOCUMENTS

| 2014/0019820 A1* | 1/2014 | Vardy | ................... H03M 13/13 |
| | | | 714/752 |
| 2015/0026543 A1 | 1/2015 | Li et al. | |

(Continued)

FOREIGN PATENT DOCUMENTS

| CN | 1933335 A | 3/2007 |
| CN | 102158235 A | 8/2011 |

(Continued)

OTHER PUBLICATIONS

Hashemi et al., Fast and flexible successive cancellation list decoders for polar codes, 2017, IEEE transaction on signal processing, vol. 65, No. 21, pp. 5756 to 5769.*

(Continued)

*Primary Examiner* — Shelly A Chase
(74) *Attorney, Agent, or Firm* — Fish & Richardson P.C.

(57) ABSTRACT

The present disclosure relates to decoding methods and devices. One example method includes receiving N LLRs corresponding to a to-be-decoded signal, where N is a code length, classifying K decoded bits into reliable bits and unreliable bits based on at least one of a prior LLR or a posterior LLR, generating M decoding paths based on the N LLRs and a preset rule, and selecting each stage of target decoding path based on PM values of the M decoding paths to obtain a decoding result of each stage of decoded bit.

20 Claims, 8 Drawing Sheets

(51) Int. Cl.
   *H03M 13/09*   (2006.01)
   *H03M 13/11*   (2006.01)
   *H03M 13/13*   (2006.01)
   *H03M 13/29*   (2006.01)

(52) U.S. Cl.
   CPC ....... *H03M 13/1108* (2013.01); *H03M 13/13* (2013.01); *H03M 13/2927* (2013.01)

(56) References Cited

U.S. PATENT DOCUMENTS

| | | | |
|---|---|---|---|
| 2015/0092886 A1 | 4/2015 | Ionita et al. | |
| 2015/0236717 A1* | 8/2015 | El-Khamy | G06F 11/1004 714/807 |
| 2015/0263767 A1 | 9/2015 | Shin et al. | |
| 2018/0241504 A1* | 8/2018 | Raza | H03M 13/6561 |

FOREIGN PATENT DOCUMENTS

| | | |
|---|---|---|
| CN | 103368583 A | 10/2013 |
| CN | 103856218 A | 6/2014 |
| EP | 2704330 A1 | 3/2014 |
| EP | 2824841 A1 | 1/2015 |

OTHER PUBLICATIONS

Cao et al, "Low complexity list successive cancellation decoding of polar codes", IET Communications, The Institution of Engineering and TEchnology, GB, vol. 8, No. 17, Nov. 27, 2014, 4 pages.

Zhang et al, "A Split-Reduced Successive Cancellation List Decoder for Polar Codes", IEEE Journal on Selected Area, in Communications, vol. 34, No. 2, Feb. 2016, 11 pages.

Extended European Search Report issued in European Application No. 17838496.2 dated Aug. 9, 2019, 10 pages.

International Search Report and Written Opinion issued in PCT/CN2017/092179 dated Oct. 11, 2017, 20 pages.

* cited by examiner

DECODING METHOD AND DEVICE, AND DECODER

CROSS-REFERENCE TO RELATED APPLICATIONS

This application is a continuation of International Application No. PCT/CN2017/092179, filed on Jul. 7, 2017, which claims priority to Chinese Patent Application No. 201610665446.5, filed on Aug. 12, 2016. The disclosures of the aforementioned applications are hereby incorporated by reference as if reproduced in their entireties.

TECHNICAL FIELD

This application relates to the field of encoding and decoding technologies, and in particular, to a decoding method and device, and a decoder.

BACKGROUND

A polar code is an encoding method that theoretically proves that a Shannon limit can be achieved. The polar code is a linear block code whose encoding process is $x_1^N = u_1^N B_N F_2^{\otimes (log_2(N))}$, where $u_1^N = (u_1, u_2, \ldots, u_N)$ is a binary row vector whose length is N, $B_N$ is an N×N bit reversal matrix, $$F_2 = \begin{bmatrix} 1 & 0 \\ 1 & 1 \end{bmatrix},$$

and $F_2^{\otimes (log_2(N))}$ is a Kronecker product of $log_2 N$ matrices $F_2$. Some bits in $u_1^N$ are used for information transmission, and are referred to as information bits, and a remaining bit is set to a frozen bit. The polar code has excellent decoding performance in a wide working range (a code length, a code rate, and a signal-to-noise ratio).

A decoding process of an existing successive cancellation (SC) decoding algorithm is as follows: After a signal is received, log-likelihood ratios (LLR) of information bits are calculated one by one. If an LLR of an information bit is greater than 0, a decoding result is 0. If an LLR of an information bit is less than 0, a decoding result is 1. A decoding result is set to 0 regardless of a value of an LLR of a frozen bit. FIG. 1 is a schematic diagram of an SC decoding calculation process. For example, there are four decoded bits. There are eight computing nodes in total in FIG. 1. There are four F nodes and four G nodes, and the F node and the G node respectively correspond to an F function and a G function. Calculation for the F node requires two LLR inputs on a right side of the F node. Calculation for the G node requires two LLR inputs on a right side of the G node and an upper-stage output that is also used as an input. An output can be calculated only after input calculation is completed. According to the foregoing calculation rule, in FIG. 1, starting from receiving a signal from the right side, calculation is sequentially performed for the eight nodes, the obtained decoded bits are successively ①→②→③→④, and decoding is completed. It can be learned that the SC algorithm is to make a decision bit by bit. Once a decision is wrong, a wrong result of the decision is used as an input of a G function for a following bit. Consequently, an error spreads and there is no chance to recover the error. Therefore, decoding performance is not high. To resolve this problem, in a successive cancellation list (SCL) algorithm, decoding results corresponding to 0 and 1 are both stored as two branch decoding paths in the SCL algorithm. FIG. 2 is a schematic diagram of a decoding path in the SCL algorithm. As shown in FIG. 2, each layer represents one decoded bit. If a decoding result is 0, a path is developed along a left subtree. If a decoding result is 1, a path is developed along a right subtree. When a total quantity of decoding paths exceeds a preset path width L (usually L=2$^n$), L paths with optimal path metric (PM) values are selected and stored, and a path continues to be developed, to decode a following decoded bit. For each stage of decoded bit, PM values of the L paths are sorted in ascending order, and a correct path is selected by using the PM values and cyclic redundancy check (CRC). This process is repeated in this way until a last bit is decoded. PM is used to determine path quality, and the PM is obtained through LLR calculation.

In actual application, a quantity of decoded bits is very large. By using the SCL decoding algorithm, decoding performance is better. In addition, the following disadvantage existing in the SC algorithm is avoided: An error of one decoded bit spreads to a following decoded bit. However, PM values of all paths need to be calculated, and all the paths need to be sorted based on the PM values for each decoded bit. Consequently, both calculation complexity and sorting complexity of the SCL decoding algorithm are high.

SUMMARY

This application provides a decoding method and device, and a decoder, so that parallel decoding can be performed based on a path priority, thereby reducing calculation complexity of polar code decoding while ensuring relatively good decoding performance.

According to a first aspect, this application provides a decoding method, including: receiving N log-likelihood ratios LLRs corresponding to a to-be-decoded signal, where N is a code length; first classifying K decoded bits into reliable bits and unreliable bits based on a prior LLR and/or a posterior LLR, where the prior LLR is an average LLR that is of a decoded bit and that is obtained based on channel statistical information, and the posterior LLR is an LLR that is of a decoded bit and that is calculated in real time based on the N LLRs; then generating M decoding paths based on the N LLRs and a preset rule, where 1≤M≤Q, and Q is a preset total quantity of decoding paths; a total quantity of paths at each stage does not exceed L, L is a preset total quantity of decoding paths with a same length, and L≤Q; the preset rule is that: there is one next-stage path for the reliable bits, and there are two next-stage paths for the unreliable bits; a decoding path with a path length of j consists of decision results of a first to a $j^{th}$ decoded bits, and each decision result corresponds to one stage of the decoding path; K is a final quantity of decoded bits; and N, M, Q, L, K, and j are all positive integers, and 1≤j≤N; then selecting each stage of target decoding path based on path metric PM values of the M decoding paths, to obtain a decoding result of each stage of decoded bit; and finally, when a length of a first decoding path reaches N, performing cyclic redundancy check (CRC) on K decoded bits in the first decoding path, and returning a decoding success result if the CRC succeeds; or, continuing to perform CRC on K decoded bits in a next decoding path whose length reaches N, and returning a decoding failure result if a result of performing the CRC on K decoded bits in each decoding path whose length reaches N is that the CRC fails. The decoded bits are classified before the decoding paths are generated or when the decoding paths are generated, a path is not split for the reliable bits, and a path is split for the unreliable bits. Therefore, a quantity of times that a path is split is reduced, thereby reducing a total quantity of decoding paths. Therefore, a quantity of paths whose PM values need to be calculated and a quantity of paths participating in the sorting are reduced, and calculation complexity and sorting complexity are reduced, ensuring relatively good decoding performance.

It should be noted that the decoded bits in this application may be information bits, or may be an information bit and a frozen bit. When the decoded bits are an information bit and a frozen bit, when classification is performed for the reliable bits and the unreliable bits, because a decoding result of the frozen bit is decided, in other words, the decoding result is 0 regardless of a value of the LLR, the frozen bit may be directly classified into a reliable bit. The frozen bit does not affect overall calculation complexity.

In a possible design, during the generating M decoding paths based on the N LLRs and a preset rule, the method further includes: selecting l decoding paths with minimum PM values from the M decoding paths, and developing the l decoding paths in parallel, where $1 \leq l \leq L$.

An optimal path is preferentially extended, so that a correct decoding result can be found as soon as possible, and decoding can be completed as soon as possible, to reduce a decoding delay and complexity. Compared with an SCL algorithm, a decoding delay can also be reduced when there are advantages of reducing calculation complexity and sorting complexity and also ensuring relatively good decoding performance.

In a possible design, the classifying K decoded bits into reliable bits and unreliable bits based on a prior LLR and/or a posterior LLR is: obtaining the reliable bits and the unreliable bits through classification according to the following rule:

$$\begin{cases} \text{If } |LLR_{post}(j)| \geq C \cdot LLR_{prior}(j) \text{ or} \\ \quad LLR_{prior}(j) \geq \theta, & j \in \text{a reliable bit} \\ \text{If } |LLR_{post}(j)| < C \cdot LLR_{prior}(j) \text{ and} \\ \quad LLR_{prior}(j) < \theta, & j \in \text{an unreliable bit} \end{cases} ; \text{or}$$

$$\begin{cases} \text{If } LLR_{prior}(j) \geq \theta, & j \in \text{a reliable bit} \\ \text{If } LLR_{prior}(j) < \theta, & j \in \text{an unreliable bit} \end{cases} ; \text{or}$$

$$\begin{cases} \text{If } |LLR_{post}(j)| \geq \eta, & j \in \text{a reliable bit} \\ \text{If } |LLR_{post}(j)| < \eta, & j \in \text{an unreliable bit} \end{cases}, \text{where}$$

$LLR_{prior}(j)$ is the prior LLR, $LLR_{post}(j)$ is the posterior LLR, C, θ, and η are preset parameters, j is the $j^{th}$ bit, and $1 \leq j \leq N$.

In a possible design, the generating M decoding paths based on the N LLRs and a preset rule includes: calculating an LLR of each stage of decoded bit in each decoding path in real time based on the N LLRs, and calculating a PM value of the corresponding decoding path based on the LLR of each stage of decoded bit; and generating the decoding path according to the preset rule, selecting M decoding paths with minimum PM values when a total quantity of generated decoding paths is greater than Q, and sorting the M decoding paths in ascending order of PM values.

In a possible design, the calculating an LLR of each stage of decoded bit in each decoding path in real time based on the N LLRs, and calculating a PM value of the corresponding decoding path based on the LLR of each stage of decoded bit is: calculating a PM value of each decoding path according to the following formulas:

$$PM_l^0 = 0, \forall l$$
$$PM_l^j = PM_l^{j-1} + \Delta_{post}^j + \Delta_{prior}^j, j \in \{1, \ldots, N\} ;$$
$$\Delta_{post}^j = \begin{cases} 0, & \text{sign}(LLR_{post}(j)) = 1 - 2 \cdot z(j) \\ |LLR_{post}(j)|, & \text{otherwise} \end{cases},$$

where z(j) is a decision value of the $j^{th}$ bit, and the value is 0 or 1; and $$\Delta_{prior}^j = -\int_0^\infty \Delta_{post}^j f(\Delta_{post}^j) d\Delta_{post}^j,$$

where $f(x)$ is a probability density function of x; and $PM_l^j$ is a PM value of a decoding path corresponding to the $j^{th}$ decoded bit, and $\Delta_{prior}^j$ is negation of a mean value of $\Delta_{post}^j$.

Path metric proposed in this application not only includes posterior information, but also considers prior information. In this way, path quality can be reflected more accurately, thereby reducing a time for finding an optimal path. Through experimental simulation, after the PM value defined above is used, not only a quantity Q of paths that need to be stored is greatly reduced, but also a time required for finding a correct path is reduced.

In a possible design, before the selecting each stage of target decoding path based on path metric PM values of the M decoding paths, the method further includes: sorting the M decoding paths in ascending order of PM values based on a sorting condition, where the sorting condition is that: only currently split paths are sorted, and a path that is not split does not participate in the sorting. By using the foregoing insertion sorting method, sorting complexity may be further reduced, a time required for decoding may be reduced, and a decoding delay may be reduced.

In a possible design, when M=Q, the method further includes:

enabling path management to preferentially develop a shorter path until a difference between a length of a longest decoding path in all decoding paths and a length of a shortest decoding path in all the decoding paths is less than or equal to a preset threshold.

In a possible design, the method further includes: pruning at least one decoding path whose PM value is greater than a preset value in the M decoding paths, where the preset value is obtained through offline calculation or online calculation.

The preset value is $$\min_{l \in \{1, \ldots, Q\}} |PM_l| + \ln(K \cdot L) + B,$$

where B is a preset parameter.

In a decoding process, the PM value is updated, several optimal paths are reserved, and a worst path is eliminated, so that an optimal decoding result can be found. Therefore, relatively good decoding performance can be ensured through the foregoing path management and pruning processing.

In a possible design, the prior LLR is obtained through calculation according to the following formula:

$$LLR_{prior}(j)_{\text{Send an all-zero codeword}} = \int_{-\infty}^{+\infty} LLR_{post}(j) f(LLR_{post}(j)) dLLR_{post}(j),$$

where
$LLR_{prior}(j)$ is the prior LLR.

In a possible design, the decoding method in this application may be implemented by using pseudo code in the following example:

```
While M>0
    If "M<Q" or "d<D"
        pop an optimal path from a PM queue
    Else
        pop a shortest path from a length queue
    End
    update a path length (+1)
    update a width of a decoding tree at the bit
    If w == L
        detect all shorter paths
    End
    use a PM value for pruning
    If a frozen bit or a prior/posterior reliable bit
        do not split a path, and use a hard decision result
    Else
        split a path, and reserve a path corresponding to 0/1
    End
    If j == N and CRC check succeeds
        return a decoding result
    Else
        delete a current path
    End
    If "split"
        insert two newly generated paths into the PM queue
        insert the two newly generated paths into the length queue
    End
End
return "decoding fails"
```

The length queue is a decoding path queue, namely, a queue including a plurality of decoding paths.

According to a second aspect, this application provides a decoding device, including:

a receiving module, configured to receive N log-likelihood ratios LLRs corresponding to a to-be-decoded signal, where N is a code length; a classification module, configured to classify K decoded bits into reliable bits and unreliable bits based on a prior LLR and/or a posterior LLR, where the prior LLR is an average LLR that is of a decoded bit and that is obtained based on channel statistical information, and the posterior LLR is an LLR that is of a decoded bit and that is calculated in real time based on the N LLRs; a generation module, configured to generate M decoding paths based on the N LLRs and a preset rule, where 1≤M≤Q, and Q is a preset total quantity of decoding paths; a total quantity of paths at each stage does not exceed L, L is a preset total quantity of decoding paths with a same length, and L≤Q; the preset rule is that: there is one next-stage path for the reliable bits, and there are two next-stage paths for the unreliable bits; a decoding path with a path length of j consists of decision results of a first to a $j^{th}$ decoded bits, and each decision result corresponds to one stage of the decoding path; K is a final quantity of decoded bits; and N, M, Q, L, K, and j are all positive integers, and 1≤j≤N; a selection module, configured to select each stage of target decoding path based on path metric PM values of the M decoding paths, to obtain a decoding result of each stage of decoded bit; and a check module, configured to: when a length of a first decoding path reaches N, perform cyclic redundancy check CRC on K decoded bits in the first decoding path, and return a decoding success result if the CRC succeeds; or, continue to perform CRC on K decoded bits in a next decoding path whose length reaches N, and return a decoding failure result if a result of performing the CRC on K decoded bits in each decoding path whose lengths reaches N is that the CRC fails.

In a possible design, when generating the M decoding paths based on the N LLRs and the preset rule, the generation module is further configured to: select l decoding paths with minimum PM values from the M decoding paths, and develop the l decoding paths in parallel, where 1≤l≤L.

In a possible design, the classification module is configured to obtain the reliable bits and the unreliable bits through classification according to the following rule:

$$\begin{cases} \text{If } |LLR_{post}(j)| \geq C \cdot LLR_{prior}(j) \text{ or} \\ \quad LLR_{prior}(j) \geq \theta, & j \in \text{a reliable bit} \\ \text{If } |LLR_{post}(j)| < C \cdot LLR_{prior}(j) \text{ and} \\ \quad LLR_{prior}(j) < \theta, & j \in \text{an unreliable bit} \end{cases}; \text{or}$$

$$\begin{cases} \text{If } LLR_{prior}(j) \geq \theta, & j \in \text{a reliable bit} \\ \text{If } LLR_{prior}(j) < \theta, & j \in \text{an unreliable bit} \end{cases}; \text{or}$$

$$\begin{cases} \text{If } |LLR_{post}(j)| \geq \eta, & j \in \text{a reliable bit} \\ \text{If } |LLR_{post}(j)| < \eta, & j \in \text{an unreliable bit} \end{cases}, \text{where}$$

$LLR_{prior}(j)$ is the prior LLR, $LLR_{post}(j)$ is the posterior LLR, $C$, $\theta$, and $\eta$ are preset parameters, j is the $j^{th}$ bit, and 1≤j≤N.

In a possible design, the generation module is configured to: calculate an LLR of each stage of decoded bit in each decoding path in real time based on the N LLRs, and calculate a PM value of the corresponding decoding path based on the LLR of each stage of decoded bit; and generate the decoding path according to the preset rule, select M decoding paths with minimum PM values when a total quantity of generated decoding paths is greater than Q, and sort the M decoding paths in ascending order of PM values.

In a possible design, the generation module is configured to calculate a PM value of each decoding path according to the following formulas:

$$PM_l^0 = 0, \forall l$$
$$PM_l^j = PM_l^{j-1} + \Delta_{post}^j + \Delta_{prior}^j, j \in \{1, \ldots, N\};$$

$$\Delta_{post}^j = \begin{cases} 0, & \text{sign}(LLR_{post}(j)) = 1 - 2 \cdot z(j) \\ |LLR_{post}(j)|, & \text{otherwise} \end{cases},$$

where z(j) is a decision value of the $j^{th}$ bit, and the value is 0 or 1; and $$\Delta_{prior}^j = -\int_0^\infty \Delta_{post}^j f(\Delta_{post}^j) d\Delta_{post}^j,$$

where $f(x)$ is a probability density function of x; and $PM_l^j$ is a PM value of a decoding path corresponding to the $j^{th}$ decoded bit, and $\Delta_{prior}^j$ is negation of a mean value of $\Delta_{post}^j$.

In a possible design, the selection module is further configured to: before selecting each stage of target decoding path based on the path metric PM values of the M decoding paths, sort the M decoding paths in ascending order of PM values based on a sorting condition, where the sorting condition is that: only currently split paths are sorted, and a path that is not split does not participate in the sorting.

In a possible design, the decoding device further includes: a path management module, configured to enable path management when M=Q, to preferentially develop a shorter path until a difference between a length of a longest decoding path in all decoding paths and a length of a shortest decoding path in all the decoding paths is less than or equal to a preset threshold.

In a possible design, the decoding device further includes: a pruning module, configured to prune at least one decoding path whose PM value is greater than a preset value in the M decoding paths, where the preset value is obtained through offline calculation or online calculation.

The preset value is $$\min_{l \in \{1,\ldots,Q\}} |PM_l| + \ln(K \cdot L) + B,$$

where B is a preset parameter.

In a possible design, the prior LLR is obtained through calculation according to the following formula:

$$LLR_{prior}(j)_{\text{Send an all-zero codeword}} = \int_{-\infty}^{+\infty} LLR_{post}(j) f(LLR_{post}(j)) dLLR_{post}(j),$$

where $LLR_{prior}(j)$ is the prior LLR.

For beneficial effects of the decoding device provided in the second aspect and the possible designs of the second aspect, refer to the beneficial effects brought by the first aspect and the possible designs of the first aspect. Details are not described herein again.

According to a third aspect, this application provides a decoder, including: a receiver, configured to receive N log-likelihood ratios LLRs corresponding to a to-be-decoded signal, where N is a code length; a memory, configured to store a program instruction, an LLR table, a partial sum, a decoding result, a decoding path queue, and a path metric PM value queue, where the partial sum is an input of a G function; and a processor configured to control program instruction execution, where the processor is configured to: classify K decoded bits into reliable bits and unreliable bits based on a prior LLR and/or a posterior LLR, where the prior LLR is an average LLR that is of a decoded bit and that is obtained based on channel statistical information, and the posterior LLR is an LLR that is of a decoded bit and that is calculated in real time based on the N LLRs; generate M decoding paths based on the N LLRs and a preset rule, where 1≤M≤Q, and Q is a preset total quantity of decoding paths; a total quantity of paths at each stage does not exceed L, L is a preset total quantity of decoding paths with a same length, and L≤Q; the preset rule is that: there is one next-stage path for the reliable bits, and there are two next-stage paths for the unreliable bits; a decoding path with a path length of j consists of decision results of a first to a $j^{th}$ decoded bits, and each decision result corresponds to one stage of the decoding path; K is a final quantity of decoded bits; and N, M, Q, L, K, and j are all positive integers, and 1≤j≤N; and select each stage of target decoding path based on path metric PM values of the M decoding paths, to obtain a decoding result of each stage of decoded bit; and a checker, configured to: when a length of a first decoding path reaches N, perform cyclic redundancy check CRC on K decoded bits in the first decoding path, and return a decoding success result if the CRC succeeds; or, continue to perform CRC on K decoded bits in a next decoding path whose length reaches N, and return a decoding failure result if a result of performing the CRC on K decoded bits in each decoding path whose length reaches N is that the CRC fails.

In a possible design, when generating the M decoding paths based on the N LLRs and the preset rule, the processor is further configured to: select l decoding paths with minimum PM values from the M decoding paths; and the decoder further includes: a parallel calculator, configured to develop the l decoding paths in parallel, where 1≤l≤L; an input buffer, configured to store a decoding path selected from the decoding path queue; and an output buffer, configured to store a decoding path whose PM value is calculated.

In a possible design, the processor is configured to obtain the reliable bits and the unreliable bits through classification according to the following rule:

$$\begin{cases} \text{If } |LLR_{post}(j)| \geq C \cdot LLR_{prior}(j) \text{ or} \\ \quad LLR_{prior}(j) \geq \theta, \quad j \in \text{a reliable bit} \\ \text{If } |LLR_{post}(j)| < C \cdot LLR_{prior}(j) \text{ and} \\ \quad LLR_{prior}(j) < \theta, \quad j \in \text{an unreliable bit} \end{cases} ; \text{or}$$

$$\begin{cases} \text{If } LLR_{prior}(j) \geq \theta, & j \in \text{a reliable bit} \\ \text{If } LLR_{prior}(j) < \theta, & j \in \text{an unreliable bit} \end{cases} ; \text{or}$$

$$\begin{cases} \text{If } |LLR_{post}(j)| \geq \eta, & j \in \text{a reliable bit} \\ \text{If } |LLR_{post}(j)| < \eta, & j \in \text{an unreliable bit} \end{cases}, \text{where}$$

$LLR_{prior}(j)$ is the prior LLR, $LLR_{post}(j)$ is the posterior LLR, C, θ, and η are preset parameters, j is the $j^{th}$ bit, and 1≤j≤N.

In a possible design, the processor is configured to: calculate an LLR of each stage of decoded bit in each decoding path in real time based on the N LLRs, and calculate a PM value of the corresponding decoding path based on the LLR of each stage of decoded bit; and generate the decoding path according to the preset rule, select M decoding paths with minimum PM values when a total quantity of generated decoding paths is greater than Q, and sort the M decoding paths in ascending order of PM values.

In a possible design, the processor is configured to calculate a PM value of each decoding path according to the following formulas:

$$PM_l^0 = 0, \forall l$$
$$PM_l^j = PM_l^{j-1} + \Delta_{post}^j + \Delta_{prior}^j, j \in \{1, \ldots, N\};$$
$$\Delta_{post}^j = \begin{cases} 0, & \text{sign}(LLR_{post}(j)) = 1 - 2 \cdot z(j) \\ |LLR_{post}(j)|, & \text{otherwise} \end{cases},$$

where z(j) is a decision value of the $j^{th}$ bit, and the value is 0 or 1; and $$\Delta_{prior}^{j} = -\int_{0}^{\infty} \Delta_{post}^{j} f(\Delta_{post}^{j}) d\Delta_{post}^{j},$$

where $f(x)$ is a probability density function of x; and $PM_i^j$ is a PM value of a decoding path corresponding to the $j^{th}$ decoded bit, and $\Delta_{prior}^{j}$ is negation of a mean value of $\Delta_{post}^{j}$.

In a possible design, the processor is further configured to: before selecting each stage of target decoding path based on the path metric PM values of the M decoding paths, sort the M decoding paths in ascending order of PM values based on a sorting condition, where the sorting condition is that: only currently split paths are sorted, and a path that is not split does not participate in the sorting.

In a possible design, the decoder further includes:

a path manager, configured to enable path management when M=Q, to preferentially develop a shorter path until a difference between a length of a longest decoding path in all decoding paths and a length of a shortest decoding path in all the decoding paths is less than or equal to a preset threshold.

In a possible design, the decoder further includes: a pruning controller, configured to prune at least one decoding path whose PM value is greater than a preset value in the M decoding paths, where the preset value is obtained through offline calculation or online calculation.

The preset value is $$\min_{l\in\{1,\ldots,Q\}} |PM_l| + \ln(K \cdot L) + B,$$

where B is a preset parameter.

In a possible design, the prior LLR is obtained through calculation according to the following formula:

$$LLR_{prior}(j) \underset{\text{Send an all-zero codeword}}{=} \int_{-\infty}^{+\infty} LLR_{post}(j) f(LLR_{post}(j)) dLLR_{post}(j),$$

where $LLR_{prior}(j)$ is the prior LLR.

For beneficial effects of the decoder provided in the third aspect and the possible designs of the third aspect, refer to the beneficial effects brought by the first aspect and the possible designs of the first aspect. Details are not described herein again.

According to a fourth aspect, this application provides a storage medium, including: a readable storage medium and a computer program, where the computer program is used to implement the decoding method according to the first aspect and the possible designs in the first aspect.

According to a fifth aspect, this application provides a program product, where the program product includes a computer program (namely, an execution instruction), and the computer program is stored in a readable storage medium. At least one processor of a decoding device or a decoder may read the computer program from the readable storage medium, and the at least one processor executes the computer program to enable the decoding device or the decoder to implement the decoding method provided in the first aspect and the possible designs in the first aspect.

DESCRIPTION OF EMBODIMENTS

Polar code decoding is performed by a receive end. A decoding method provided in this application mainly relates to a polar code decoding process. In existing decoding algorithms SC and SCL, the SC algorithm is to make a decision bit by bit, and sequentially decode all decoded bits. A result of a previous decoded bit is used as an input of calculation of a following decoded bit. Therefore, once a decision on the previous decoded bit is wrong, a wrong result of the previous decoded bit is used as an input of a G function for a following bit. Consequently, an error spreads and there is no chance to recover the error. Therefore, decoding performance is not high. Although this problem is avoided by using the SCL algorithm, a quantity of decoded bits in actual application is very large, PM values of all paths need to be calculated in the SCL algorithm, and all the paths need to be sorted based on the PM values for each decoded bit. Consequently, both calculation complexity and sorting complexity of polar code decoding are high. For the foregoing problem, this application provides a decoding method, so that parallel decoding can be performed based on a path priority, thereby reducing calculation complexity of polar code decoding while ensuring relatively good decoding performance. A decoding method and device, and a decoder that are provided in this application are described below in detail with reference to the accompanying drawings.

The decoding method provided in this application is mainly applied to various wireless communications systems, and may be implemented by software or hardware on a base station side/terminal side. In particular, the systems include enhanced mobile broadband (eMBB), ultra-reliable and low-latency communications (URLLC), and massive machine-type communications (mMTC) scenarios in 5G.

Network elements in this application are mainly a base station and a terminal, to implement communication between the base station and the terminal.

Figure 1:
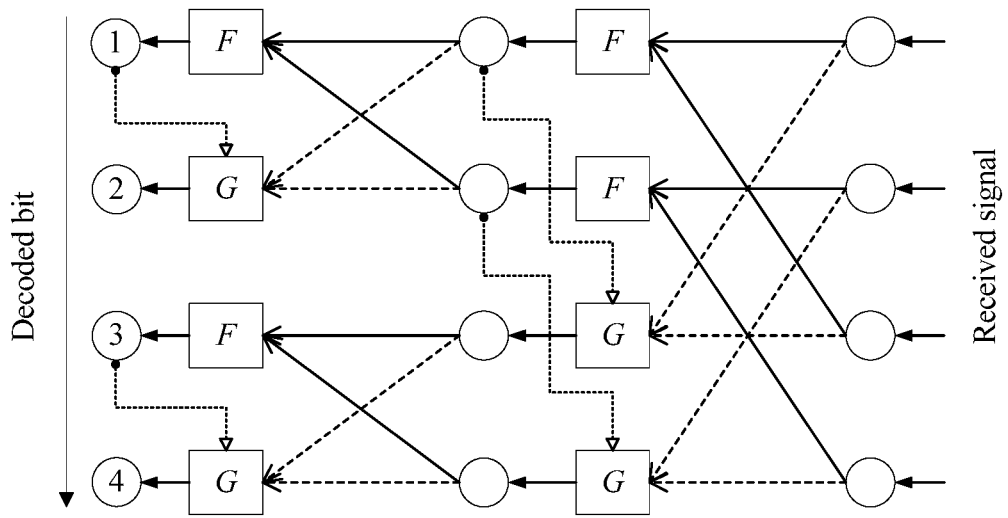
FIG. 1 is a schematic diagram of an SC decoding calculation process.
Figure 2:
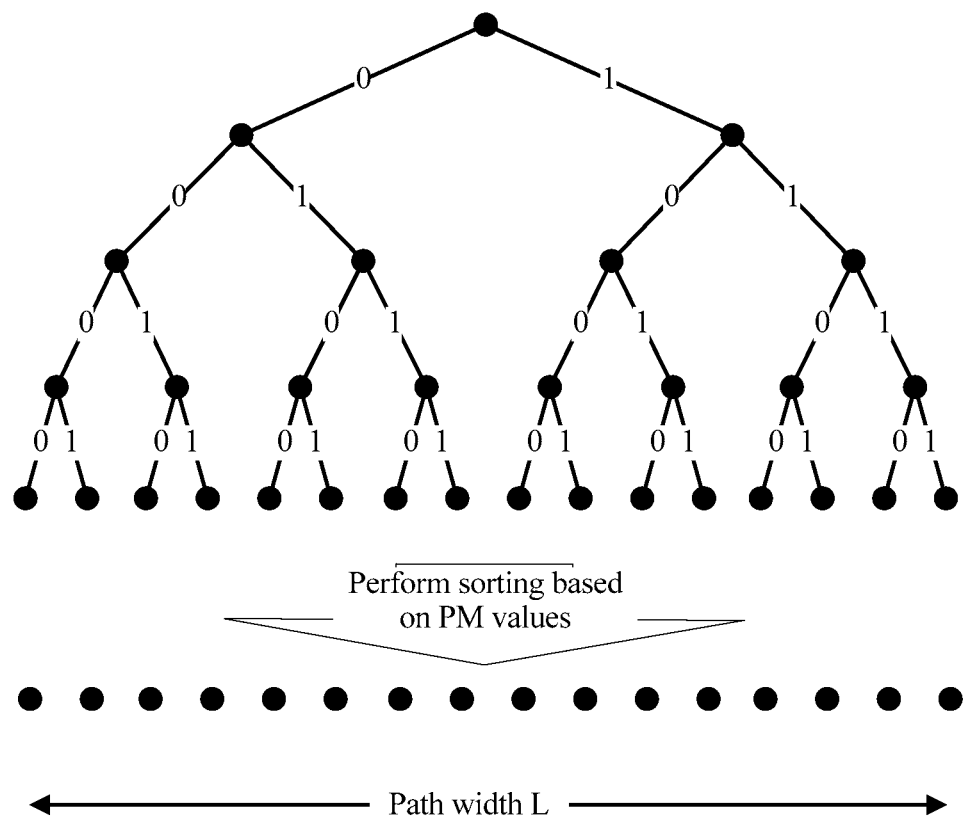
FIG. 2 is a schematic diagram of a decoding path in an SCL algorithm.
Figure 3:
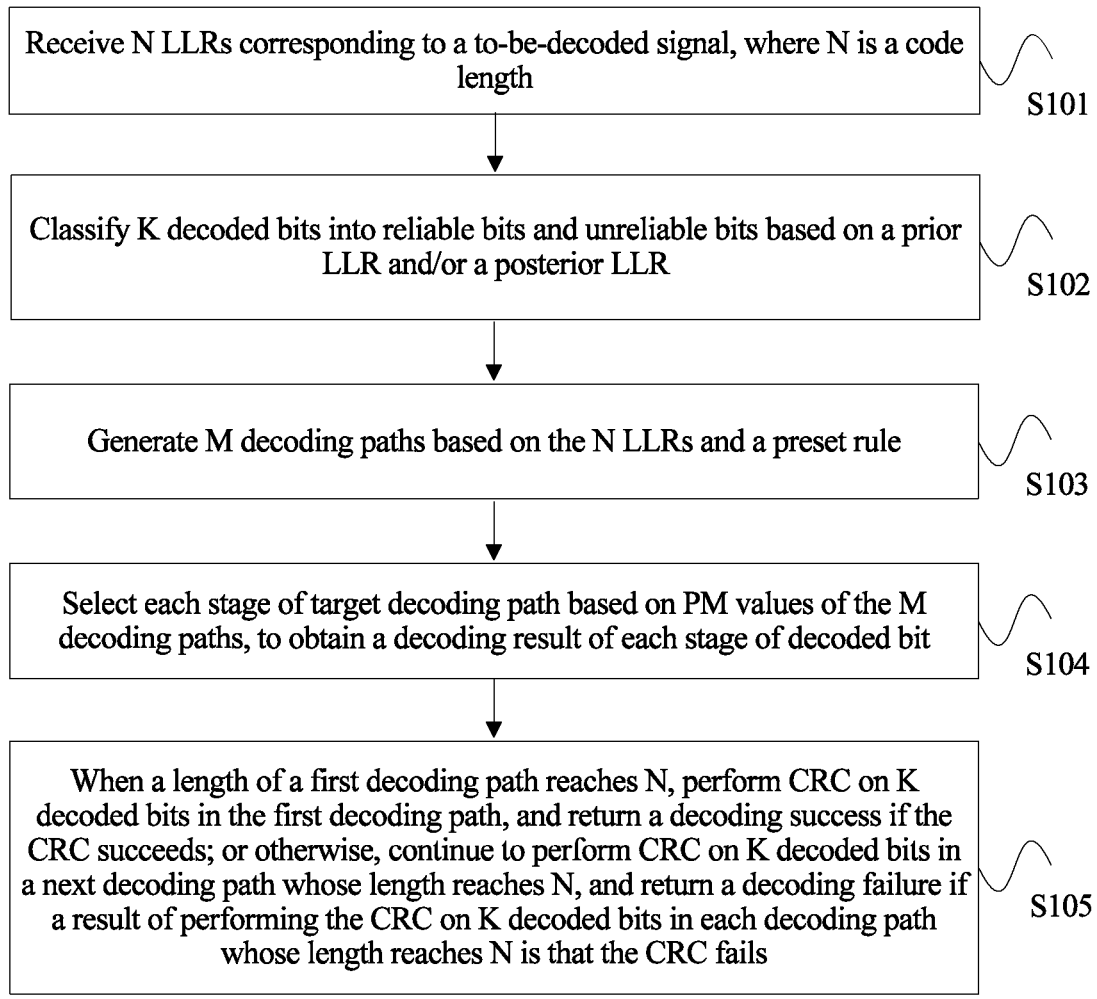
FIG. 3 is a flowchart of Embodiment 1 of a decoding method according to this application.

FIG. 3 is a flowchart of Embodiment 1 of a decoding method according to this application. As shown in FIG. 3, the method in this embodiment may include the following steps.

S101. Receive N LLRs corresponding to a to-be-decoded signal, where N is a code length.

After receiving the to-be-decoded signal, a receive end obtains, through calculation, the N LLRs corresponding to the to-be-decoded signal, and sends the N LLRs to a decoder at the receive end, where LLR=2×y/var, y is a signal value of the to-be-decoded signal, and var is a noise variance.

S102. Classify K decoded bits into reliable bits and unreliable bits based on a prior LLR and/or a posterior LLR.

Reliability of each decoded bit is measured based on the prior LLR and/or the posterior LLR, to determine whether path splitting is to be performed for the bit. The prior LLR is an average LLR that is of a decoded bit and that is obtained based on channel statistical information, and may be obtained by using an offline method such as Gaussian approximation, a polarization weight, or Monte Carlo simulation, or may be obtained by using an online method in which the decoder performs real-time statistics collection. The posterior LLR is an LLR that is of a decoded bit and that is calculated in real time based on the N LLRs, namely, an LLR that corresponds to the decoded bit and that is obtained when the decoder performs real-time decoding.

The prior LLR $LLR_{prior}(j)$ may be obtained through calculation according to the following formula:

$$LLR_{prior}(j) \underset{\text{Send an all-zero codeword}}{=} \int_{-\infty}^{+\infty} LLR_{post}(j) f(LLR_{post}(j)) dLLR_{post}(j).$$

K is a total quantity of decoded bits that need to be decoded, and is learned of by the decoder before decoding. Before the decoding paths are generated, the K decoded bits may be classified into the reliable bits and the unreliable bits based on the prior LLR. For example, a percentage of the reliable bits and that of the unreliable bits may be set based on reliability or a polarization weight of an information bit during encoding. A threshold of the prior LLR is set based on the percentages. If the prior LLR is greater than the threshold, a corresponding decoded bit is classified into a reliable bit. If the prior LLR is less than the threshold, a corresponding decoded bit is classified into an unreliable bit. A next-stage path for the reliable bits is highly determined, to be specific, there is one next-stage path. There are two next-stage paths for a unreliable bit. For example, the reliable bits and the unreliable bits may be obtained through classification according to the following rule:

$$\begin{cases} \text{If } LLR_{prior}(j) \geq \theta, & j \in \text{a reliable bit} \\ \text{If } LLR_{prior}(j) < \theta, & j \in \text{an unreliable bit} \end{cases},$$

where

θ is a preset parameter.

Alternatively, before the decoding paths are generated, the K decoded bits may be classified into the reliable bits and the unreliable bits based on the posterior LLR. For example, the K decoded bits are classified into the reliable bits and the unreliable bits in real time by comparing a "posterior LLR" obtained during decoding with an expectation of an LLR that is of an information bit and that is obtained through Gaussian approximation. For example, the reliable bits and the unreliable bits may be obtained through classification according to the following rule:

$$\begin{cases} \text{If } |LLR_{prior}(j)| \geq \eta, & j \in \text{a reliable bit} \\ \text{If } |LLR_{post}(j)| < \eta, & j \in \text{an unreliable bit} \end{cases},$$

where

η is a preset parameter.

Alternatively, the K decoded bits may be classified into the reliable bits and the unreliable bits based on the prior LLR and the posterior LLR. For example, the reliable bits and the unreliable bits may be obtained through classification according to the following rule:

$$\begin{cases} \text{If } |LLR_{post}(j)| \geq C \cdot LLR_{prior}(j) \text{ or } & j \in \text{a reliable bit} \\ LLR_{prior}(j) \geq \theta, & \\ \text{If } |LLR_{post}(j)| < C \cdot LLR_{prior}(j) \text{ and } & j \in \text{an unreliable bit} \\ LLR_{prior}(j) < \theta, & \end{cases},$$

where

C, θ and η are preset parameters, j is a $j^{th}$ bit, and $1 \leq j \leq N$.

It should be noted that the decoded bits in this application may be information bits, or may be an information bit and a frozen bit. When the decoded bits are an information bit and a frozen bit, when classification is performed to obtain the reliable bits and the unreliable bits, because a decoding result of the frozen bit is decided, in other words, the decoding result is 0 regardless of a value of the LLR, the frozen bit may be directly classified into a reliable bit. The frozen bit does not affect overall calculation complexity.

S103. Generate M decoding paths based on the N LLRs and a preset rule.

Herein, $1 \leq M \leq Q$, and Q is a preset total quantity of decoding paths, namely, a path width; a total quantity of paths at each stage does not exceed L, L is a preset total quantity of decoding paths with a same length, and $L \leq Q$; the preset rule is that: there is one next-stage path for the reliable bits, and there are two next-stage paths for the unreliable bits; a decoding path with a path length of j consists of decision results of a first to a $j^{th}$ decoded bits, and each decision result corresponds to one stage of the decoding path; K is a final quantity of decoded bits; and N, M, Q, L, and K are all positive integers, and $1 \leq j \leq N$. The code length is N, and a code rate is K/N.

S103 is: first calculating an LLR of each stage of decoded bit in each decoding path in real time based on the N LLRs, and calculating a PM value of the corresponding decoding path based on the LLR of each stage of decoded bit. A PM value of each decoding path is calculated according to the following formulas:

$$PM_l^0 = 0, \forall l$$

$$PM_l^j = PM_l^{j-1} + \Delta_{post}^j + \Delta_{prior}^j, j \in \{1, \ldots, N\};$$

$$\Delta_{post}^j = \begin{cases} 0, & \text{sign}(LLR_{post}(j)) = 1 - 2 \cdot z(j) \\ |LLR_{post}(j)|, & \text{otherwise} \end{cases},$$

where z(j) is a decision value of the $j^{th}$ bit, and the value is 0 or 1; and $$\Delta_{prior}^{j} = -\int_{0}^{\infty} \Delta_{post}^{j} f(\Delta_{post}^{j}) d\Delta_{post}^{j},$$

where $f(x)$ is a probability density function of x; and $PM_j^j$ is a PM value of a decoding path corresponding to the $j^{th}$ decoded bit, and $\Delta_{prior}^{j}$ is negation of a mean value of $\Delta_{post}^{j}$.

Then, the decoding path is generated according to the preset rule, M decoding paths with minimum PM values are selected when a total quantity of generated decoding paths is greater than Q, and the M decoding paths are sorted in ascending order of PM values.

In existing SCL and SCS decoding algorithms, only a posterior LLR is considered for a PM value in the decoding algorithms, but a prior LLR is not considered. In a case of different path lengths, unfairness may be caused when short and long paths are compared. Therefore, path metric proposed in this application not only includes posterior information, but also considers prior information. In this way, path quality can be reflected more accurately, thereby reducing a time for finding an optimal path. Through experimental simulation, after the PM value defined above is used, not only a quantity Q of paths that need to be stored is greatly reduced, but also a time required for finding a correct path is reduced.

S104. Select each stage of target decoding path based on PM values of the M decoding paths, to obtain a decoding result of each stage of decoded bit.

A decoding path with a minimum PM value in the M decoding paths is selected as a target decoding path, to obtain the decoding result of each stage of decoded bit. Lengths of decoding paths corresponding to all stages of decoded bits are different. For example, a decoding result of a second-stage decoded bit is obtained. When a decoding result of a third-stage decoded bit is obtained, a decoding path with a minimum PM value in a third stage of decoding paths needs to be reselected, and the decoding result of the third-stage decoded bit is obtained based on the selected decoding path.

S105. When a length of a first decoding path reaches N, perform CRC on K decoded bits in the first decoding path, and return a decoding success result if the CRC succeeds; or, continue to perform CRC on K decoded bits in a next decoding path whose length reaches N, and return a decoding failure result if a result of performing the CRC on K decoded bits in each decoding path whose length reaches N is that the CRC fails.

According to the decoding method provided in this embodiment, after the N LLRs corresponding to the to-be-decoded signal are received, the K decoded bits are first classified into the reliable bits and the unreliable bits based on the prior LLR and/or the posterior LLR. Then, when the M decoding paths are generated based on the N LLRs, the decoding paths are generated according to the rule that there is one next-stage path for the reliable bits, and there are two next-stage paths for the unreliable bits. Then, each stage of target decoding path is selected based on the PM values of the M decoding paths, to obtain the decoding result of each stage of decoded bit. Finally, when a length of a decoding path reaches N, CRC is cyclically performed until a decoding success result or a decoding failure result is obtained, and decoding is completed. The decoded bits are classified before the decoding paths are generated and/when the decoding paths are generated, a path is not split for the reliable bits, and a path is split for the unreliable bits. Therefore, a quantity of times that a path is split is reduced, thereby reducing a total quantity of decoding paths. Therefore, a quantity of paths whose PM values need to be calculated and a quantity of paths participating in the sorting are reduced, and calculation complexity and sorting complexity are reduced, ensuring relatively good decoding performance.

Figure 4:
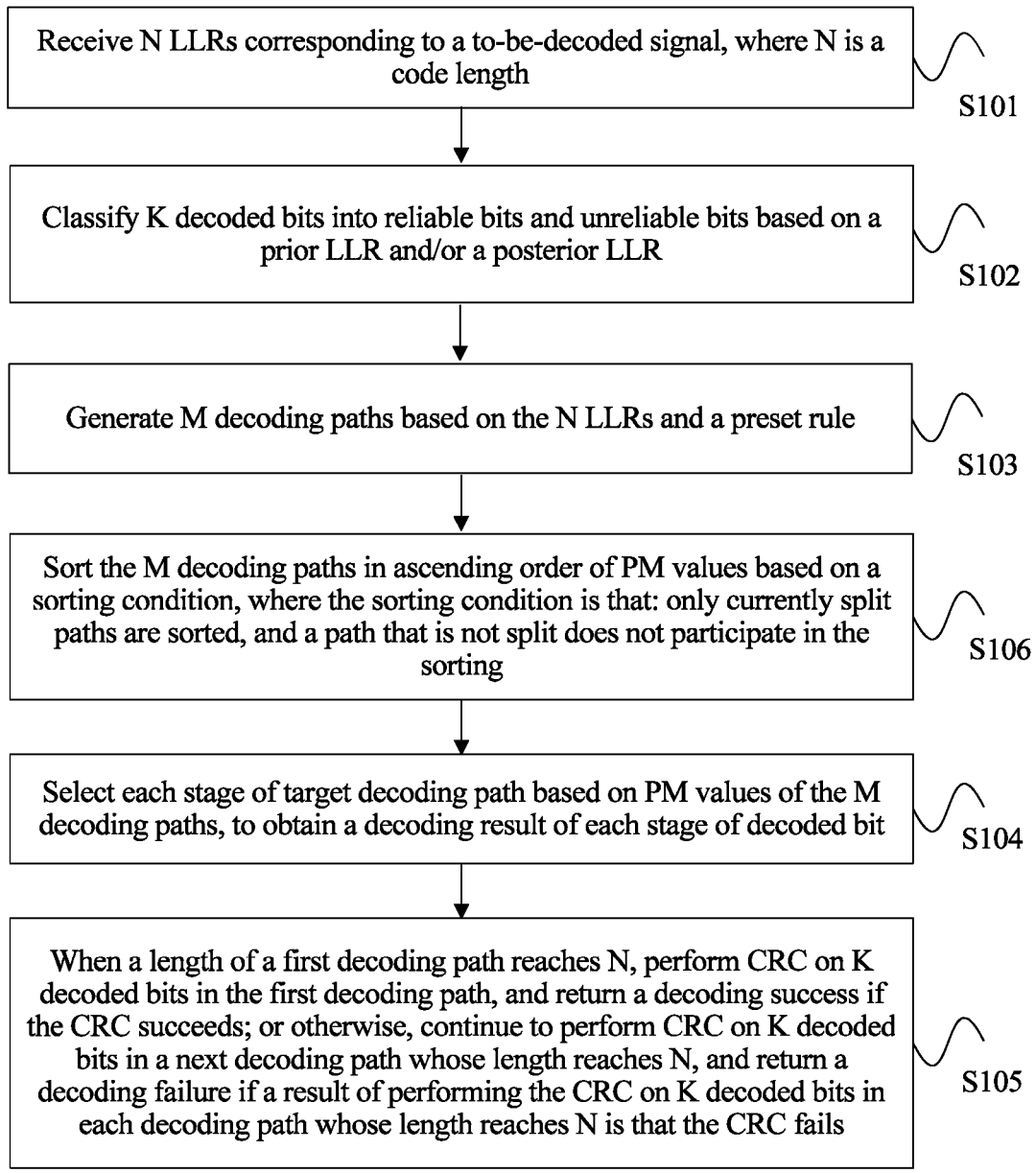
FIG. 4 is a flowchart of Embodiment 2 of a decoding method according to this application.

Further, in another optional embodiment of this application, FIG. 4 is a flowchart of Embodiment 2 of a decoding method according to this application. As shown in FIG. 4, before S104 in Embodiment 1 shown in FIG. 3, the method may further include the following step:

S106. Sort the M decoding paths in ascending order of PM values based on a sorting condition, where the sorting condition is that: only currently split paths are sorted, and a path that is not split does not participate in the sorting.

By using the foregoing step, namely, an insertion sorting method, sorting complexity may be further reduced, a time required for decoding may be reduced, and a decoding delay may be reduced.

Optionally, based on the foregoing embodiment, in a process of continuously developing the decoding path, when M=Q, path management is enabled, to preferentially develop a shorter path until a difference between a length of a longest decoding path in all decoding paths and a length of a shortest decoding path in all the decoding paths is less than or equal to a preset threshold.

A difference between lengths of short and long paths is relatively large in this application, and after the PM value defined in this application is used, a correct path may still be eliminated. Therefore, before a path is eliminated, it needs to be ensured that the difference between the lengths of the short and long paths is not relatively large. Decoding performance may be further improved.

Optionally, based on the foregoing embodiment, the method may further include:

pruning at least one decoding path whose PM value is greater than a preset value in the M decoding paths, where the preset value is obtained through offline calculation or online calculation. During online calculation, the preset value may be initialized to a maximum value, and the value is updated by collecting statistics on a maximum PM value of a correct decoding path. During offline calculation, the preset value may be:

$$\min_{l \in \{1,\ldots,Q\}} |PM_l| + \ln(K \cdot L) + B,$$

where K is a quantity of decoded bits (if there is a CRC bit, the CRC bit should be counted in), and is a preset total quantity of decoding paths with a same length; and B is a preset parameter, is a constant, and may be set to 3.

In a case of a relatively high signal-to-noise ratio (which is usually a signal-to-noise ratio (SNR) range corresponding to a block error rate (BLER)<$10^{-3}$), a difference between PM values of paths is relatively large. In this case, by comparing a PM value with a PM value of an optimal path, a relatively poor path is pruned, so that complexity can be reduced. In a case of a middle signal-to-noise ratio (which is usually an SNR range corresponding to $10^{-3}$<BLER<0.5× $10^{-1}$), a difference between PM values of paths is not excessively large. Therefore, a difference between longest and shortest paths may be controlled through path management, to ensure fair path comparison and elimination. In a case of a low signal-to-noise ratio (which is usually an SNR range corresponding to BLER>0.5×10$^{-1}$), PM values of almost all paths are very small. In this case, the PM value should be compared with a preset threshold, to prune all paths whose PM values are greater than the threshold.

The PM value has a function of evaluating path quality in polar code decoding. Usually, a smaller PM value indicates that a path corresponding to the PM value is more likely a correct path, in other words, indicates a better path. In a decoding process, the PM value is updated, several optimal paths are reserved, and a worst path is eliminated, so that an optimal decoding result can be found. Therefore, relatively good decoding performance can be ensured through the foregoing path management and pruning processing.

Figure 5:
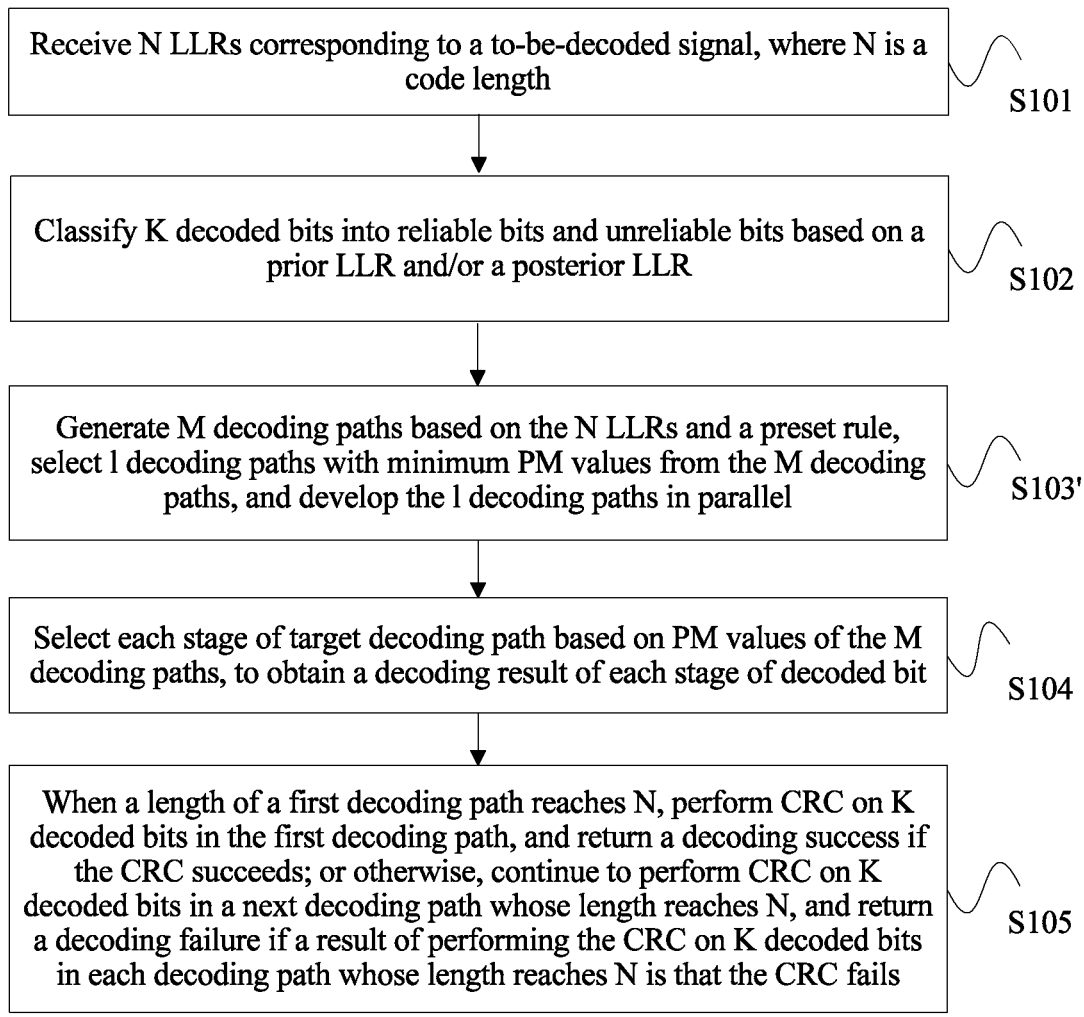
FIG. 5 is a flowchart of Embodiment 3 of a decoding method according to this application.

FIG. 5 is a flowchart of Embodiment 3 of a decoding method according to this application. As shown in FIG. 5, based on FIG. 3 or FIG. 4, in the method in this embodiment, when the M decoding paths are generated based on the N LLRs and the preset rule in S103, the method may further include:

selecting l decoding paths with minimum PM values from the M decoding paths, and developing the l decoding paths in parallel, where 1≤l≤L.

S103'. Generate the M decoding paths based on the N LLRs and the preset rule, select l decoding paths with minimum PM values from the M decoding paths, and develop the l decoding paths in parallel, where 1≤l≤L.

To be specific, in a decoding tree consisting of decoding paths, the l decoding paths whose PMs are optimal in the M decoding paths are preferentially extended in parallel, and lengths of different decoding paths in the decoding tree are not necessarily the same. l may be referred to as a parallelism degree, and 1≤l≤L. When l=1, the parallelism degree is the same as that in a successive cancellation stack (SCS) algorithm. When l=L, the parallelism degree is the same as that in the SCL.

Because a split reducing operation described in the embodiment shown in FIG. 3 or FIG. 4 is used, a relatively low path split rate means that the l paths proceed almost independently, and are similar to l parallel SC decoders. A calculation speed of the parallel SC decoders may be very high. In addition, when one of the l paths is split, a queue operation (namely, developing two new paths) caused by the split may be performed when LLRs of other l−1 paths are calculated. Through the foregoing parallel operation, an actual parallelism degree is very high.

According to the decoding algorithm provided in this embodiment, an optimal path is preferentially extended, so that a correct decoding result can be found as soon as possible, and decoding can be completed as soon as possible, to reduce a decoding delay and complexity. Compared with the SCL algorithm, a decoding delay can also be reduced when there are advantages of reducing calculation complexity and sorting complexity and also ensuring relatively good decoding performance.

Figure 6:
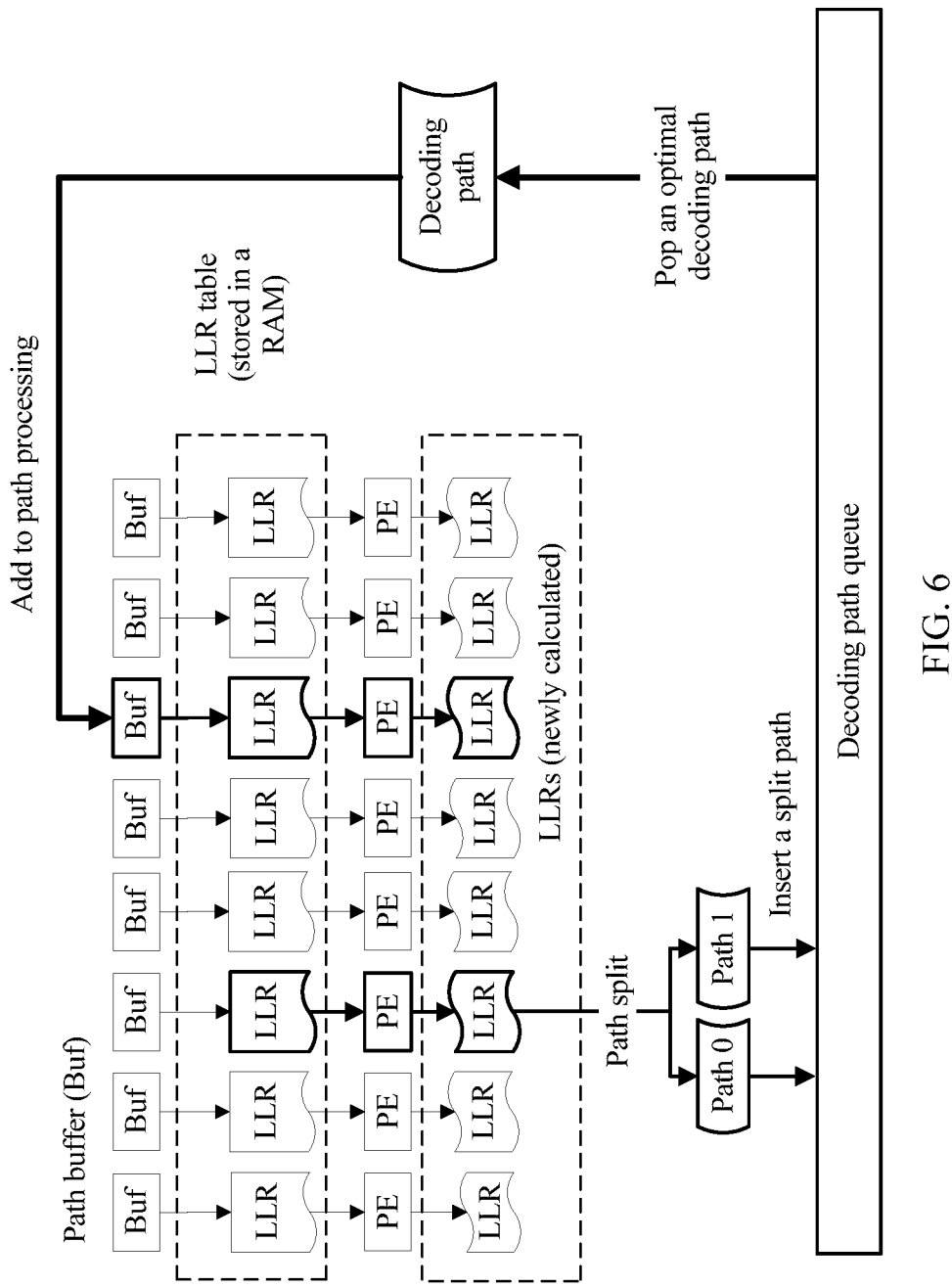
FIG. 6 is a diagram of a parallel calculation framework according to the embodiment shown in FIG. 5.

FIG. 6 is a diagram of a parallel calculation framework of the embodiment shown in FIG. 5. As shown in FIG. 6, during specific software or hardware implementation, the parallel calculation framework includes:

1. Priority queue operation rule: A decoding path queue with a length of Q is used to store information about Q paths (PM values and path lengths). Herein, l optimal decoding paths are preferentially selected from the queue, where l shown in FIG. 6 is 8. The optimal decoding paths are sent to a path buffer (Buf). Herein, l parallel calculation units (such as process elements (PEs)) are responsible for path processing on the selected optimal paths, namely, bit-by-bit decoding, and for performing a path insertion operation on the queue only when a path is split. As shown in FIG. 6, two newly generated paths (a path 0 and a path 1) are inserted into the decoding path queue.

2. l-parallel calculation architecture: Partial parallel calculation is performed on a decoding tree with a width of L, to be specific, l optimal paths are selected from the queue for simultaneous processing, where l is referred to as a parallelism degree, and 1≤l≤L. When l=1, the parallelism degree is the same as that in the SCS. When l=L, the parallelism degree is the same as that in the SCL algorithm.

3. l-storage architecture: Only LLR tables (stored in a RAM) of l decoding paths that are currently processed by the parallel calculation units are stored, so that a quantity l of LLR tables is less than or equal to L. When the decoding path that is currently processed needs to be switched to another decoding path, because an LLR table of a new decoding path is not stored, some LLR values need to be recalculated. However, because two LLR tables usually include relatively high redundancy, a quantity of LLR values that need to be recalculated is usually not very large. In practice, only LLR values for decoded bits with different decision results between two decoding paths need to be additionally calculated.

The decoding method in this application may be implemented by using pseudo code in the following example:

```
While M>0
    If "M<Q" or "d<D"
        pop an optimal path from a PM queue
    Else
        pop a shortest path from a length queue
    End
    update a path length (+1)
    update a width of a decoding tree at the bit
    If w = = L
        detect all shorter paths
    End
    use a PM value for pruning
    If a frozen bit or a prior/posterior reliable bit
        do not split a path, and use a hard decision result
    Else
        split a path, and reserve a path corresponding to 0/1
    End
    If j = = N and CRC check succeeds
        return a decoding result
    Else
        delete a current path
    End
    If "split"
        insert two newly generated paths into the PM queue
        insert the two newly generated paths into the length queue
    End
End
return "decoding fails"
```

The length queue is a decoding path queue, namely, a queue including a plurality of decoding paths.

Figure 7:
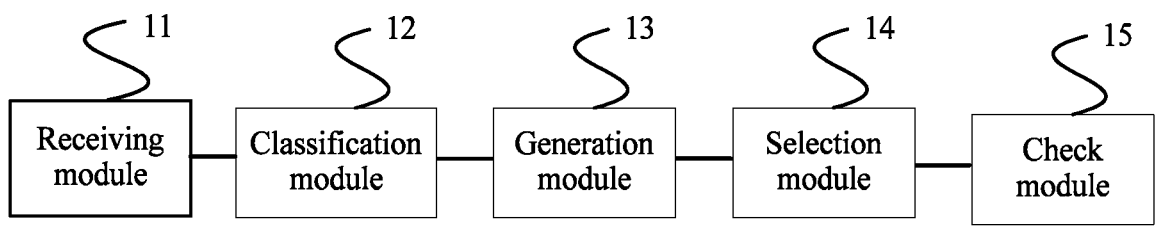
FIG. 7 is a schematic structural diagram of Embodiment 1 of a decoding device according to this application.

FIG. 7 is a schematic structural diagram of Embodiment 1 of a decoding device according to this application. As shown in FIG. 7, the decoding device in this embodiment may include a receiving module 11, a classification module 12, a generation module 13, a selection module 14, and a check module 15. The receiving module 11 is configured to receive N log-likelihood ratios LLRs corresponding to a to-be-decoded signal, where N is a code length. The classification module 12 is configured to classify K decoded bits into reliable bits and unreliable bits based on a prior LLR and/or a posterior LLR, where the prior LLR is an average LLR that is of a decoded bit and that is obtained based on channel statistical information, and the posterior LLR is an LLR that is of a decoded bit and that is calculated in real time based on the N LLRs. The generation module 13 is configured to generate M decoding paths based on the N LLRs and a preset rule, where 1≤M≤Q, and Q is a preset total quantity of decoding paths; a total quantity of paths at each stage does not exceed L, L is a preset total quantity of decoding paths with a same length, and L≤Q; the preset rule is that: there is one next-stage path for the reliable bits, and there are two next-stage paths for the unreliable bits; a decoding path with a path length of j consists of decision results of a first to a $j^{th}$ decoded bits, and each decision result corresponds to one stage of the decoding path; K is a final quantity of decoded bits; and N, M, Q, L, and K are all positive integers, and 1≤j≤N. The selection module 14 is configured to select each stage of target decoding path based on path metric PM values of the M decoding paths, to obtain a decoding result of each stage of decoded bit. The check module 15 is configured to: when a length of a first decoding path reaches N, perform cyclic redundancy check CRC on K decoded bits in the first decoding path, and return a decoding success result if the CRC succeeds; or, continue to perform CRC on K decoded bits in a next decoding path whose length reaches N, and return a decoding failure result if a result of performing the CRC on K decoded bits in each decoding path whose length reaches N is that the CRC fails.

Further, the classification module 12 is configured to obtain the reliable bits and the unreliable bits through classification according to the following rule:

$$\begin{cases} \text{If } |LLR_{post}(j)| \geq C \cdot LLR_{prior}(j) \text{ or } & j \in \text{a reliable bit} \\ LLR_{prior}(j) \geq \theta, \\ \text{If } |LLR_{post}(j)| < C \cdot LLR_{prior}(j) \text{ and } & j \in \text{an unreliable bit} \\ LLR_{prior}(j) < \theta, \end{cases} ; \text{or}$$

$$\begin{cases} \text{If } LLR_{prior}(j) \geq \theta, & j \in \text{a reliable bit} \\ \text{If } LLR_{prior}(j) < \theta, & j \in \text{an unreliable bit} \end{cases} ; \text{or}$$

$$\begin{cases} \text{If } |LLR_{post}(j)| \geq \eta, & j \in \text{a reliable bit} \\ \text{If } |LLR_{post}(j)| < \eta, & j \in \text{an unreliable bit} \end{cases}, \text{where}$$

$LLR_{prior}(j)$ is the prior LLR, $LLR_{post}(j)$ is the posterior LLR, C, θ, and η are preset parameters, j is the $j^{th}$ bit, and 1≤j≤N.

The prior LLR is obtained through calculation according to the following formula:

$$LLR_{prior}(j)\Big|_{\text{Send an all-zero codeword}} = \int_{-\infty}^{+\infty} LLR_{post}(j) f(LLR_{post}(j)) dLLR_{post}(j),$$

where $LLR_{prior}(j)$ is the prior LLR.

Optionally, the generation module 13 is configured to: calculate an LLR of each stage of decoded bit in each decoding path in real time based on the N LLRs, and calculate a PM value of the corresponding decoding path based on the LLR of each stage of decoded bit; and generate the decoding path according to the preset rule, select M decoding paths with minimum PM values when a total quantity of generated decoding paths is greater than Q, and sort the M decoding paths in ascending order of PM values.

The generation module 13 is configured to calculate a PM value of each decoding path according to the following formulas:

$$PM_l^0 = 0, \forall l$$

$$PM_l^j = PM_l^{j-1} + \Delta_{post}^j + \Delta_{prior}^j, \ j \in \{1, \ldots, N\};$$

$$\Delta_{post}^j = \begin{cases} 0, & \text{sign}(LLR_{post}(j)) = 1 - 2 \cdot z(j) \\ |LLR_{post}(j)|, & \text{otherwise} \end{cases},$$

where z(j) is a decision value of the $j^{th}$ bit, and the value is 0 or 1; and $$\Delta_{prior}^j = -\int_0^\infty \Delta_{post}^j f(\Delta_{post}^j) d\Delta_{post}^j,$$

where f(x) is a probability density function of x; and $PM_l^j$ is a PM value of a decoding path corresponding to the $j^{th}$ decoded bit, and $\Delta_{prior}^j$ is negation of a mean value of $\Delta_{post}^j$.

Optionally, the selection module 14 is further configured to: before selecting each stage of target decoding path based on the path metric PM values of the M decoding paths, sort the M decoding paths in ascending order of PM values based on a sorting condition, where the sorting condition is that: only currently split paths are sorted, and a path that is not split does not participate in the sorting. By using an insertion sorting method, sorting complexity may be further reduced, a time required for decoding may be reduced, and a decoding delay may be reduced.

The decoding device in this embodiment may be configured to execute the technical solution in the method embodiment shown in FIG. 3 or FIG. 4. An implementation principle of the decoding device is similar to that in the method embodiment and is not described herein again.

According to the decoding device provided in this embodiment, after the N LLRs corresponding to the to-be-decoded signal are received, the K decoded bits are first classified into the reliable bits and the unreliable bits based on the prior LLR and/or the posterior LLR. Then, when the M decoding paths are generated based on the N LLRs, the decoding paths are generated according to the rule that there is one next-stage path for the reliable bits, and there are two next-stage paths for the unreliable bits. Then, each stage of target decoding path is selected based on the PM values of the M decoding paths, to obtain the decoding result of each stage of decoded bit. Finally, when a length of a decoding path reaches N, CRC is cyclically performed until a decoding success result or a decoding failure result is obtained, and decoding is completed. The decoded bits are classified before the decoding paths are generated and/when the decoding paths are generated, a path is not split for the reliable bits, and a path is split for the unreliable bits. Therefore, a quantity of times that a path is split is reduced, thereby reducing a total quantity of decoding paths. Therefore, a quantity of paths whose PM values need to be calculated and a quantity of paths participating in the sorting are reduced, and calculation complexity and sorting complexity are reduced, ensuring relatively good decoding performance.

Further, based on the decoding device provided in the foregoing embodiment, when generating the M decoding paths based on the N LLRs and the preset rule, the generation module 13 is further configured to: select 1 decoding paths with minimum PM values from the M decoding paths, and develop the 1 decoding paths in parallel, where 1≤l≤L.

The decoding device in this embodiment may be configured to execute the technical solution in the method embodiment shown in FIG. 5. An implementation principle of the decoding device is similar to that in the method embodiment and is not described herein again.

According to the decoding device provided in this embodiment, an optimal path is preferentially extended, so that a correct decoding result can be found as soon as possible, and decoding can be completed as soon as possible, to reduce a decoding delay and complexity. Compared with an SCL algorithm, a decoding delay can also be reduced when there are advantages of reducing calculation complexity and sorting complexity and also ensuring relatively good decoding performance.

Figure 8:
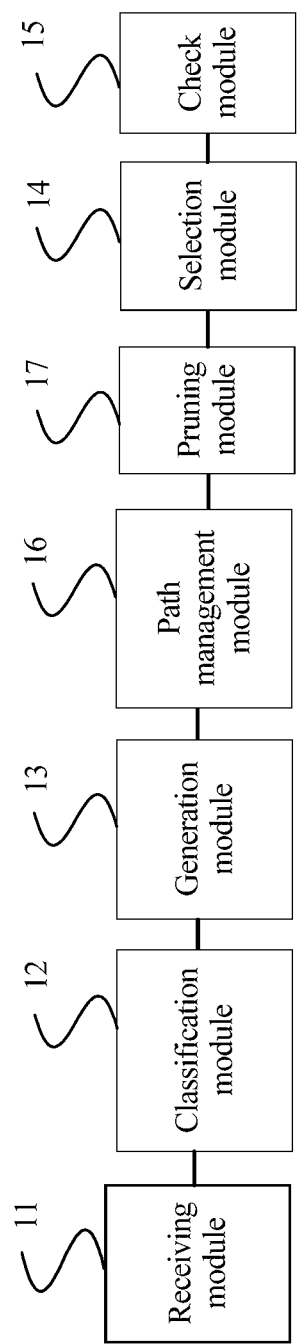
FIG. 8 is a schematic structural diagram of Embodiment 2 of a decoding device according to this application.

FIG. 8 is a schematic structural diagram of Embodiment 2 of a decoding device according to this application. As shown in FIG. 8, based on the device structure shown in FIG. 7, the decoding device in this embodiment may further include a path management module 16. The path management module 16 is configured to enable path management when M=Q, to preferentially develop a shorter path until a difference between a length of a longest decoding path in all decoding paths and a length of a shortest decoding path in all the decoding paths is less than or equal to a preset threshold.

Further, the decoding device may further include: a pruning module 17, configured to prune at least one decoding path whose PM value is greater than a preset value in the M decoding paths, where the preset value is obtained through offline calculation or online calculation. The preset value may be:

$$\min_{l \in \{1,\ldots,Q\}} |PM_l| + \ln(K \cdot L) + B,$$

B is a preset parameter.

According to the decoder provided in this embodiment, in a decoding process, the PM value is updated, several optimal paths are reserved, and a worst path is eliminated, so that an optimal decoding result can be found. Therefore, relatively good decoding performance can be ensured through the foregoing path management and pruning processing.

Figure 9:
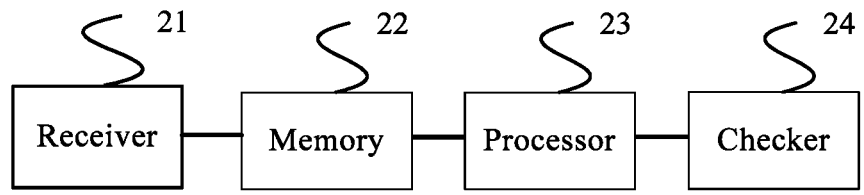
FIG. 9 is a schematic structural diagram of Embodiment 1 of a decoder according to this application.

FIG. 9 is a schematic structural diagram of Embodiment 1 of a decoder according to this application. As shown in FIG. 9, the decoder in this embodiment may include a receiver 21, a memory 22, a processor 23 configured to control program instruction execution, and a checker 24. The receiver 21 is configured to receive N log-likelihood ratios LLRs corresponding to a to-be-decoded signal, where N is a code length. The memory 22 is configured to store a program instruction, an LLR table, a partial sum, a decoding result, a decoding path queue, and a PM value queue, where the partial sum is an input of a G function. The processor 23 is configured to: classify K decoded bits into reliable bits and unreliable bits based on a prior LLR and/or a posterior LLR, where the prior LLR is an average LLR that is of a decoded bit and that is obtained based on channel statistical information, and the posterior LLR is an LLR that is of a decoded bit and that is calculated in real time based on the N LLRs; generate M decoding paths based on the N LLRs and a preset rule, where 1≤M≤Q, and Q is a preset total quantity of decoding paths; a total quantity of paths at each stage does not exceed L, L is a preset total quantity of decoding paths with a same length, and L≤Q; the preset rule is that: there is one next-stage path for the reliable bits, and there are two next-stage paths for the unreliable bits; a decoding path with a path length of j consists of decision results of a first to a $j^{th}$ decoded bits, and each decision result corresponds to one stage of the decoding path; K is a final quantity of decoded bits; and N, M, Q, L, and K are all positive integers, and 1≤j≤N; and select each stage of target decoding path based on path metric PM values of the M decoding paths, to obtain a decoding result of each stage of decoded bit. The checker 24 is configured to: when a length of a first decoding path reaches N, perform cyclic redundancy check CRC on K decoded bits in the first decoding path, and return a decoding success result if the CRC succeeds; or, continue to perform CRC on K decoded bits in a next decoding path whose length reaches N, and return a decoding failure result if a result of performing the CRC on K decoded bits in each decoding path whose length reaches N is that the CRC fails.

The prior LLR is obtained through calculation according to the following formula:

$$LLR_{prior}(j) \Big|_{\text{Send an all-zero codeword}} = \int_{-\infty}^{+\infty} LLR_{post}(j) f(LLR_{post}(j)) dLLR_{post}(j),$$

where $LLR_{prior}(j)$ is the prior LLR.

According to the decoder provided in this embodiment, after the N LLRs corresponding to the to-be-decoded signal are received, the K decoded bits are first classified into the reliable bits and the unreliable bits based on the prior LLR and/or the posterior LLR. Then, when the M decoding paths are generated based on the N LLRs, the decoding paths are generated according to the rule that there is one next-stage path for the reliable bits, and there are two next-stage paths for the unreliable bits. Then, each stage of target decoding path is selected based on the PM values of the M decoding paths, to obtain the decoding result of each stage of decoded bit. Finally, when a length of a decoding path reaches N, CRC is cyclically performed until a decoding success result or a decoding failure result is obtained, and decoding is completed. The decoded bits are classified before the decoding paths are generated and/when the decoding paths are generated, a path is not split for the reliable bits, and a path is split for the unreliable bits. Therefore, a quantity of times that a path is split is reduced, thereby reducing a total quantity of decoding paths. Therefore, a quantity of paths whose PM values need to be calculated and a quantity of paths participating in the sorting are reduced, and calculation complexity and sorting complexity are reduced, ensuring relatively good decoding performance.

Figure 10:
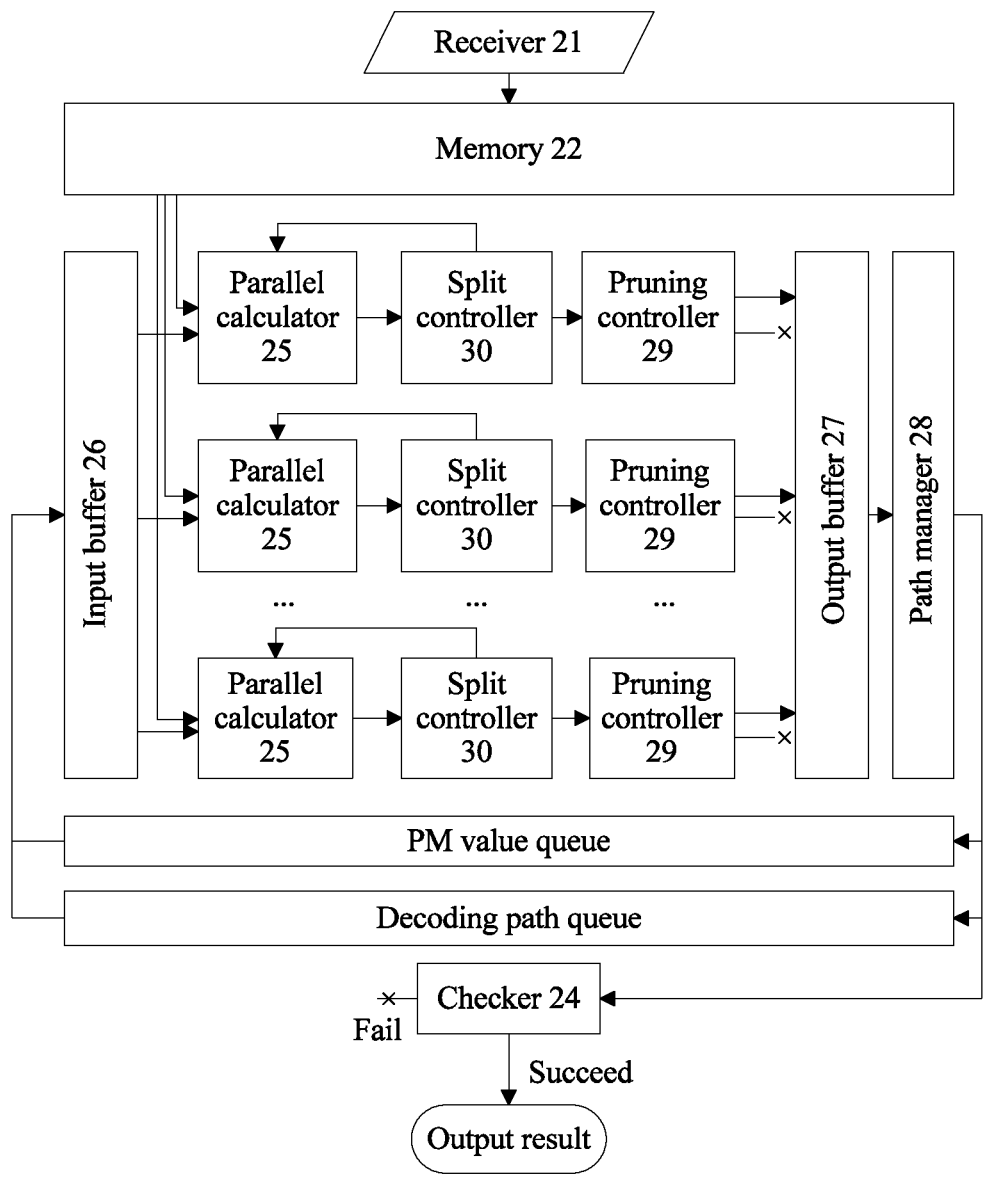
FIG. 10 is a schematic structural diagram of Embodiment 2 of a decoder according to this application.

FIG. 10 is a schematic structural diagram of Embodiment 2 of a decoder according to this application. As shown in FIG. 10, based on the decoder shown in FIG. 9, the decoder in this embodiment may further include a parallel calculator 25, an input buffer 26, and an output buffer 27. It should be noted that operations performed by the processor 23 may be performed by the parallel calculator 25 and a split controller 30 together in FIG. 10. There are l parallel calculators 25. When generating the M decoding paths based on the N LLRs and the preset rule, the processor 23 is further configured to select l decoding paths with minimum PM values from the M decoding paths. The parallel calculator 25 is configured to develop the l decoding paths in parallel, where 1≤l≤L. The input buffer 26 is configured to store a decoding path selected from the decoding path queue. The output buffer 27 is configured to store a decoding path whose PM value is calculated. An optimal path is preferentially extended, so that a correct decoding result can be found as soon as possible, and decoding can be completed as soon as possible, to reduce a decoding delay and complexity. Compared with an SCL algorithm, a decoding delay can also be reduced when there are advantages of reducing calculation complexity and sorting complexity and also ensuring relatively good decoding performance.

Further, the processor 23 is configured to:

obtain the reliable bits and the unreliable bits through classification according to the following rule:

$$\begin{cases} \text{If } |LLR_{post}(j)| \geq C \cdot LLR_{prior}(j) \text{ or } & j \in \text{a reliable bit} \\ LLR_{prior}(j) \geq \theta, \\ \text{If } |LLR_{post}(j)| < C \cdot LLR_{prior}(j) \text{ and } & j \in \text{an unreliable bit} \\ LLR_{prior}(j) < \theta, \end{cases} ; \text{or}$$

$$\begin{cases} \text{If } LLR_{prior}(j) \geq \theta, & j \in \text{a reliable bit} \\ \text{If } LLR_{prior}(j) < \theta, & j \in \text{an unreliable bit} \end{cases} ; \text{or}$$

$$\begin{cases} \text{If } |LLR_{post}(j)| \geq \eta, & j \in \text{a reliable bit} \\ \text{If } |LLR_{post}(j)| < \eta, & j \in \text{an unreliable bit} \end{cases} , \text{where}$$

$LLR_{prior}(j)$ is the prior LLR, $LLR_{post}(j)$ is the posterior LLR, $C$, $\theta$, and $\eta$ are preset parameters, $j$ is the $j^{th}$ bit, and $1 \leq j \leq N$.

Further, the processor 23 is configured to: calculate an LLR of each stage of decoded bit in each decoding path in real time based on the N LLRs, and calculate a PM value of the corresponding decoding path based on the LLR of each stage of decoded bit; and generate the decoding path according to the preset rule, select M decoding paths with minimum PM values when a total quantity of generated decoding paths is greater than Q, and sort the M decoding paths in ascending order of PM values. The processor 23 is configured to calculate a PM value of each decoding path according to the following formulas:

$$PM_l^0 = 0, \forall l$$

$$PM_l^j = PM_l^{j-1} + \Delta_{post}^j + \Delta_{prior}^j, j \in \{1, \ldots, N\};$$

$$\Delta_{post}^j = \begin{cases} 0, & \text{sign}(LLR_{post}(j)) = 1 - 2 \cdot z(j) \\ |LLR_{post}(j)|, & \text{otherwise} \end{cases},$$

where $z(j)$ is a decision value of the $j^{th}$ bit, and the value is 0 or 1; and $$\Delta_{prior}^j = -\int_0^\infty \Delta_{post}^j f(\Delta_{post}^j) d\Delta_{post}^j,$$

where $f(x)$ is a probability density function of x; and $PM_l^j$ is a PM value of a decoding path corresponding to the jth decoded bit, and $\Delta_{prior}^j$ is negation of a mean value of $\Delta_{post}^j$.

Optionally, the processor 23 is further configured to: before selecting each stage of target decoding path based on the path metric PM values of the M decoding paths, sort the M decoding paths in ascending order of PM values based on a sorting condition, where the sorting condition is that: only currently split paths are sorted, and a path that is not split does not participate in the sorting. By using an insertion sorting method, sorting complexity may be further reduced, a time required for decoding may be reduced, and a decoding delay may be reduced.

As shown in FIG. 10, optionally, the decoder further includes a path manager 28 and a pruning controller 29.

The path manager 28 is configured to enable path management when M=Q, to preferentially develop a shorter path until a difference between a length of a longest decoding path in all decoding paths and a length of a shortest decoding path in all the decoding paths is less than or equal to a preset threshold.

The pruning controller 29 is configured to prune at least one decoding path whose PM value is greater than a preset value in the M decoding paths, where the preset value is obtained through offline calculation or online calculation. The preset value is:

$$\min_{l \in \{1, \ldots, Q\}} |PM_l| + \ln(K \cdot L) + B,$$

where

B is a preset parameter.

According to the decoder provided in this embodiment, in a decoding process, the PM value is updated, several optimal paths are reserved, and a worst path is eliminated, so that an optimal decoding result can be found. Therefore, relatively good decoding performance can be ensured through the foregoing path management and pruning processing.

In specific implementation of the decoding device or the decoder, a computer program and a memory may be further included. The computer program is stored in the memory, and the processor runs the computer program to perform the foregoing decoding method. There is at least one processor configured to execute an execution instruction stored in the memory, namely, the computer program, so that a terminal device exchanges data with a network device by using a communications interface, to perform the decoding method provided in various implementations of the foregoing aspects. Optionally, the memory may be alternatively integrated into the processor.

This application further provides a storage medium, including a readable storage medium and a computer program, where the computer program is used to implement the decoding method performed by the decoding device or the decoder.

This application further provides a program product. The program product includes a computer program (namely, an execution instruction), and the computer program is stored in a readable storage medium. At least one processor of a decoding device or a decoder may read the computer program from the readable storage medium, and the at least one processor executes the computer program to enable the decoding device or the decoder to implement the decoding method provided in the foregoing implementations.

Persons of ordinary skill in the art may understand that all or some of the steps of the method embodiments may be implemented by a program instructing relevant hardware. The program may be stored in a computer-readable storage medium. When the program runs, the steps of the method embodiments are performed. The foregoing storage medium includes any medium that can store program code, such as a ROM, a RAM, a magnetic disk, or an optical disc.

The foregoing descriptions are merely specific implementations of this application, but are not intended to limit the protection scope of this application. Any variation or replacement readily figured out by persons skilled in the art within the technical scope disclosed in the present invention shall fall within the protection scope of this application. Therefore, the protection scope of this application shall be subject to the protection scope of the claims.

What is claimed is:

1. A method for decoding a to-be-decoded signal executed at a decoder system, wherein the decoder system includes at least one memory and at least one processor, wherein the at least one memory is configured to store a program instruction, and wherein the at least one processor is configured to control program instruction execution to cause the method to be performed, the method comprising:
receiving, at the decoder system, N log-likelihood ratios (LLRs) corresponding to a to-be-decoded signal, wherein N is a code length;
classifying, at the decoder system, K decoded bits into reliable bits and unreliable bits based on at least one of a prior LLR or a posterior LLR, wherein the prior LLR is an average LLR that is of a decoded bit and that is obtained based on channel statistical information, and the posterior LLR is an LLR that is of a decoded bit and that is calculated in real time based on the N LLRs;
generating, at the decoder system, M decoding paths based on the N LLRs and a preset rule, wherein $1 \leq M \leq Q$, Q is a preset total quantity of decoding paths, a total quantity of paths at each stage does not exceed L, L is a preset total quantity of decoding paths with a same length, and $L \leq Q$, and wherein the preset rule is that: there is one next-stage path for the reliable bits and two next-stage paths for the unreliable bits, a decoding path with a path length of j consists of decision results of a first to a $j^{th}$ decoded bit, and each decision result corresponds to one stage of the decoding path, K is a final quantity of decoded bits, N, M, Q, L, K, and j are all positive integers, and $1 \leq j \leq N$;
selecting, at the decoder system, each stage of target decoding path based on path metric (PM) values of the M decoding paths to obtain a decoding result of each stage of decoded bits;
when a length of a first decoding path reaches N, performing, at the decoder system, cyclic redundancy check (CRC) on K decoded bits in the first decoding path; and at least one of:
returning, at the decoder system, a decoding success result if the CRC succeeds; or
continuing to perform, at the decoder system, CRC on K decoded bits in a next decoding path whose length reaches N, and returning a decoding failure result if a result of performing the CRC on K decoded bits in each decoding path whose length reaches N is that the CRC fails.

2. The method according to claim 1, wherein during the generating M decoding paths based on the N LLRs and a preset rule, the method further comprises:
selecting l decoding paths with minimum PM values from the M decoding paths, and developing the l decoding paths in parallel, wherein $1 \leq l \leq L$.

3. The method according to claim 1, wherein the classifying K decoded bits into reliable bits and unreliable bits based on at least one of a prior LLR or a posterior LLR comprises:
obtaining the reliable bits and the unreliable bits through classification according to one of the following rules:

$$\begin{cases} \text{If} |LLR_{post}(j)| \geq C \cdot LLR_{prior}(j) \text{ or} & j \in \text{a reliable bit} \\ LLR_{prior}(j) \geq \theta, \\ \text{If} |LLR_{post}(j)| < C \cdot LLR_{prior}(j) \text{ and} & j \in \text{an unreliable bit} \\ LLR_{prior}(j) < \theta, \end{cases};$$

$$\begin{cases} \text{If } LLR_{prior}(j) \geq \theta, & j \in \text{a reliable bit} \\ \text{If } LLR_{prior}(j) < \theta, & j \in \text{an unreliable bit} \end{cases};$$

and $$\begin{cases} \text{If} |LLR_{post}(j)| \geq \eta, & j \in \text{a reliable bit} \\ \text{If} |LLR_{post}(j)| < \eta, & j \in \text{an unreliable bit} \end{cases},$$

wherein $LLR_{prior}(j)$ is the prior LLR, $LLR_{post}(j)$ is the posterior LLR, C, $\theta$, and $\eta$ are preset parameters, j is the $j^{th}$ bit, and $1 \leq j \leq N$.

4. The method according to claim 1, wherein the generating M decoding paths based on the N LLRs and a preset rule comprises:
calculating an LLR of each stage of decoded bit in each decoding path in real time based on the N LLRs, and calculating a PM value of the corresponding decoding path based on the LLR of each stage of decoded bit; and
generating the decoding path according to the preset rule, selecting M decoding paths with minimum PM values when a total quantity of generated decoding paths is greater than Q, and sorting the M decoding paths in ascending order of PM values.

5. The method according to claim 4, wherein the calculating an LLR of each stage of decoded bit in each decoding path in real time based on the N LLRs, and calculating a PM value of the corresponding decoding path based on the LLR of each stage of decoded bit comprises:
calculating a PM value of each decoding path according to the following formulas:

$$PM_l^0 = 0, \forall l$$
$$PM_l^j = PM_l^{j-1} + \Delta_{post}^j + \Delta_{prior}^j, j \in \{1, \ldots, N\};$$

$$\Delta_{post}^j = \begin{cases} 0, & \text{sign}(LLR_{post}(j)) = 1 - 2 \cdot z(j) \\ |LLR_{post}(j),| & \text{otherwise} \end{cases},$$

wherein z(j) is a decision value of the $j^{th}$ bit, and the value is 0 or 1; and $$\Delta_{prior}^j = -\int_0^\infty \Delta_{post}^j f(\Delta_{post}^j) d\Delta_{post}^j,$$

wherein $f(x)$ is a probability density function of x; and $PM_l^j$ is a PM value of a decoding path corresponding to the $j^{th}$ decoded bit, and $\Delta_{prior}^j$ is negation of a mean value of $\Delta_{post}^j$.

6. The method according to claim 1, wherein before the selecting each stage of target decoding path based on path metric (PM) values of the M decoding paths, the method further comprises:
sorting the M decoding paths in ascending order of PM values based on a sorting condition, wherein the sorting condition is that: only currently split paths are sorted, and a path that is not split does not participate in the sorting.

7. The method according to claim 1, wherein when M=Q, the method further comprises:
enabling path management to preferentially develop a shorter path until a difference between a length of a longest decoding path in all decoding paths and a length of a shortest decoding path in all the decoding paths is less than or equal to a preset threshold.

8. The method according to claim 1, further comprising:
pruning at least one decoding path whose PM value is greater than a preset value in the M decoding paths, wherein the preset value is obtained through offline calculation or online calculation.

9. The method according to claim 8, wherein the preset value is:

$$\min_{l \in \{1, \ldots, Q\}} |PM_l| + \ln(K \cdot L) + B,$$

wherein

B is a preset parameter.

10. The method according to claim 1, wherein the prior LLR is obtained through calculation according to the following formula:

$$LLR_{prior}(j) \Big|_{\text{Send an all-zero codeword}} = \int_{-\infty}^{+\infty} LLR_{post}(j) f(LLR_{post}(j)) dLLR_{post}(j),$$

wherein $LLR_{prior}(j)$ is the prior LLR.

11. A decoder, comprising:
a receiver, the receiver configured to receive N log-likelihood ratios (LLRs) corresponding to a to-be-decoded signal, wherein N is a code length;
at least one memory, the at least one memory configured to store a program instruction, an LLR table, a partial sum, a decoding result, a decoding path queue, and a path metric PM value queue, wherein the partial sum is an input of a G function; and
at least one processor, the at least one processor configured to control program instruction execution, wherein the at least one processor is configured to:
classify K decoded bits into reliable bits and unreliable bits based on at least one of a prior LLR or a posterior LLR, wherein the prior LLR is an average LLR that is of a decoded bit and that is obtained based on channel statistical information, and the posterior LLR is an LLR that is of a decoded bit and that is calculated in real time based on the N LLRs;
generate M decoding paths based on the N LLRs and a preset rule, wherein 1≤M≤Q, Q is a preset total quantity of decoding paths, a total quantity of paths at each stage does not exceed L, L is a preset total quantity of decoding paths with a same length, and L≤Q, and wherein the preset rule is that: there is one next-stage path for the reliable bits and two next-stage paths for the unreliable bits, a decoding path with a path length of j consists of decision results of a first to a $j^{th}$ decoded bits, and each decision result corresponds to one stage of the decoding path K is a final quantity of decoded bits N, M, Q, L, K, and j are all positive integers, and 1≤j≤N; and
select each stage of target decoding path based on path metric (PM) values of the M decoding paths to obtain a decoding result of each stage of decoded bit;
when a length of a first decoding path reaches N, perform cyclic redundancy check (CRC) on K decoded bits in the first decoding path; and at least one of:
return a decoding success if the CRC succeeds; or
continue to perform CRC on K decoded bits in a next decoding path whose length reaches N, and return a decoding failure if a result of performing the CRC on K decoded bits in each decoding path whose length reaches N is that the CRC fails.

12. The decoder according to claim 11, wherein when generating the M decoding paths based on the N LLRs and the preset rule, the at least one processor is further configured to:
select l decoding paths with minimum PM values from the M decoding paths; and
develop the l decoding paths in parallel, wherein 1≤l≤L; and
the at least one memory is further configured to:
store a decoding path selected from the decoding path queue; and
store a decoding path whose PM value is calculated.

13. The decoder according to claim 11, wherein the at least one processor is configured to:
obtain the reliable bits and the unreliable bits through classification according to one of the following rules:

$$\begin{cases} \text{If} |LLR_{post}(j)| \geq C \cdot LLR_{prior}(j) \text{ or} & j \in \text{a reliable bit} \\ LLR_{prior}(j) \geq \theta, & \\ \text{If} |LLR_{post}(j)| < C \cdot LLR_{prior}(j) \text{ and} & j \in \text{an unreliable bit} \\ LLR_{prior}(j) < \theta, & \end{cases};$$

$$\begin{cases} \text{If } LLR_{prior}(j) \geq \theta, & j \in \text{a reliable bit} \\ \text{If } LLR_{prior}(j) < \theta, & j \in \text{an unreliable bit} \end{cases};$$

and $$\begin{cases} \text{If} |LLR_{post}(j)| \geq \eta, & j \in \text{a reliable bit} \\ \text{If} |LLR_{post}(j)| < \eta, & j \in \text{an unreliable bit} \end{cases},$$

wherein $LLR_{prior}(j)$ is the prior LLR, $LLR_{post}(j)$ is the posterior LLR, C, θ, and η are preset parameters, j is the $j^{th}$ bit, and 1≤j≤N.

14. The decoder according to claim 11, wherein the at least one processor is configured to:
calculate an LLR of each stage of decoded bit in each decoding path in real time based on the N LLRs, and calculate a PM value of the corresponding decoding path based on the LLR of each stage of decoded bit; and
generate the decoding path according to the preset rule, select M decoding paths with minimum PM values when a total quantity of generated decoding paths is greater than Q, and sort the M decoding paths in ascending order of PM values.

15. The decoder according to claim 14, wherein the at least one processor is configured to:
calculate a PM value of each decoding path according to the following formulas:

$$PM_l^0 = 0, \forall l$$

$$PM_l^j = PM_l^{j-1} + \Delta_{post}^j + \Delta_{prior}^j, j \in \{1, \ldots, N\};$$

-continued $$\Delta_{post}^j = \begin{cases} 0, & \text{sign}(LLR_{post}(j)) = 1 - 2 \cdot z(j) \\ |LLR_{post}(j)|, & \text{otherwise} \end{cases},$$

wherein z(j) is a decision value of the $j^{th}$ bit, and the value is 0 or 1; and $$\Delta_{prior}^j = -\int_0^\infty \Delta_{post}^j f(\Delta_{post}^j) d\Delta_{post}^j,$$

wherein $f(x)$ is a probability density function of x; and $PM_i^j$ is a PM value of a decoding path corresponding to the $j^{th}$ decoded bit, and $\Delta_{prior}^j$ is negation of a mean value of $\Delta_{post}^j$.

16. The decoder according to claim 11, wherein the at least one processor is further configured to:
before selecting each stage of target decoding path based on the path metric (PM) values of the M decoding paths, sort the M decoding paths in ascending order of PM values based on a sorting condition, wherein the sorting condition is that: only currently split paths are sorted, and a path that is not split does not participate in the sorting.

17. The decoder according to claim 11, wherein the at least one processor is further configured to:
enable path management when M=Q, to preferentially develop a shorter path until a difference between a length of a longest decoding path in all decoding paths and a length of a shortest decoding path in all the decoding paths is less than or equal to a preset threshold.

18. The decoder according to claim 11, wherein the at least one processor is further configured to:
prune at least one decoding path whose PM value is greater than a preset value in the M decoding paths, wherein the preset value is obtained through offline calculation or online calculation.

19. The decoder according to claim 18, wherein the preset value is:

$$\min_{l \in [1,\ldots,Q]} |PM_l| + \ln(K \cdot L) + B,$$

wherein
B is a preset parameter.

20. The decoder according to claim 11, wherein the prior LLR is obtained through calculation according to the following formula:

$$LLR_{prior}(j) \underset{\text{Send an all-zero codeword}}{=} \int_{-\infty}^{+\infty} LLR_{post}(j) f(LLR_{post}(j)) dLLR_{post}(j),$$

wherein
$LLR_{prior}(j)$ is the prior LLR.

* * * * *